United States Patent
Kazama et al.

(10) Patent No.: US 7,602,150 B2
(45) Date of Patent: Oct. 13, 2009

(54) BATTERY DEVICE FOR ELECTRONIC APPARATUS WITH RECHARGEABLE SECONDARY BATTERY, FUEL CELL AND RUN TIME COMPUTING UNIT

(75) Inventors: Satoshi Kazama, Kawasaki (JP); Yoshiyasu Nakashima, Kawasaki (JP); Hiroshi Yamada, Kawasaki (JP); Atsushi Yamaguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 347 days.

(21) Appl. No.: 11/326,309

(22) Filed: Jan. 6, 2006

(65) Prior Publication Data

US 2007/0035273 A1 Feb. 15, 2007

(30) Foreign Application Priority Data

Aug. 11, 2005 (JP) .............................. 2005-232928

(51) Int. Cl.
*H02J 7/00* (2006.01)
(52) U.S. Cl. ...................... 320/133; 320/101; 320/112; 320/114; 324/435
(58) Field of Classification Search ................. 320/107, 320/112–114, 133, 101; 439/500; 324/435; 307/46
See application file for complete search history.

(56) References Cited

U.S. PATENT DOCUMENTS

| | | | | |
|---|---|---|---|---|
| 5,216,371 A * | 6/1993 | Nagai | ......................... | 324/428 |
| 5,635,815 A * | 6/1997 | Whitchurch et al. | ........ | 320/131 |
| 5,838,139 A * | 11/1998 | Greene | ......................... | 320/133 |
| 6,051,957 A * | 4/2000 | Klein | ......................... | 320/132 |
| 6,538,413 B1 * | 3/2003 | Beard et al. | .................. | 320/114 |
| 7,183,744 B2 * | 2/2007 | Fan et al. | ..................... | 320/112 |
| 7,289,166 B2 * | 10/2007 | Kimura | ...................... | 348/730 |
| 2004/0004458 A1 * | 1/2004 | Tanaka et al. | ................ | 320/106 |
| 2004/0061474 A1 * | 4/2004 | Ozeki | .......................... | 320/101 |
| 2004/0130296 A1 * | 7/2004 | Gross et al. | .................. | 320/133 |
| 2005/0258804 A1 * | 11/2005 | Sakuma et al. | ............... | 320/112 |
| 2006/0063044 A1 * | 3/2006 | DeVries | ......................... | 429/9 |
| 2006/0113960 A1 * | 6/2006 | Thulesius et al. | ............ | 320/133 |
| 2006/0145665 A1 * | 7/2006 | Zemke et al. | ................ | 320/133 |
| 2006/0164031 A1 * | 7/2006 | Leem | .......................... | 320/101 |
| 2006/0166045 A1 * | 7/2006 | Ryoichi | .......................... | 429/9 |
| 2007/0046250 A1 * | 3/2007 | Freiman et al. | .............. | 320/101 |
| 2007/0138996 A1 * | 6/2007 | Kobayashi | ................... | 320/101 |
| 2007/0229022 A1 * | 10/2007 | Hanafusa et al. | ............. | 320/101 |

FOREIGN PATENT DOCUMENTS

JP 2004-319367 11/2004

* cited by examiner

*Primary Examiner*—Akm E Ullah
*Assistant Examiner*—Arun Williams
(74) *Attorney, Agent, or Firm*—Staas & Halsey LLP

(57) ABSTRACT

A battery device for an electronic apparatus includes a rechargeable secondary battery, a fuel cell, and a run time computing unit receiving data representative of a voltage versus residual-capacity characteristic of the secondary battery and data representative of a residual capacity of the fuel cell and determining therefrom a residual capacity and a run time of the secondary battery and a run time of the fuel cell and estimates of which of the respective power capacities of the secondary battery and the fuel cell unit will reach the respective, predetermined residual capacities thereof earlier. If it is estimated that the fuel cell will, the computing unit determines a run time of the battery device and supplies data representative of the thus determined run time of the battery device to a power management unit of the electronic apparatus.

9 Claims, 12 Drawing Sheets

CHRACTERISTIC OF VOLTAGE VERSUS
RESIDUAL CURRENT CAPACITY

BATTERY DEVICE FOR ELECTRONIC APPARATUS WITH RECHARGEABLE SECONDARY BATTERY, FUEL CELL AND RUN TIME COMPUTING UNIT

FIELD OF THE INVENTION

The present invention generally relates to an electronic apparatus with a battery device and, more particularly, to a battery unit including a fuel cell for use with an electronic apparatus.

BACKGROUND OF THE INVENTION

A rechargeable secondary battery unit is used for a mobile notebook personal computer (PC). At present, a fuel cell unit cannot provide sufficient current for a notebook PC when it is used alone. Accordingly, it has been proposed to use a secondary battery unit in combination with a fuel cell unit for a notebook PC.

Japanese Patent Application Publication JP 2004-319367-A laid open to the public on Nov. 11, 2004 discloses a battery pack. For providing an appropriate voltage to a load, the battery pack has a battery and a DC-to-DC converter built therein. When the battery pack is connected to the load through a connector, and when an output voltage indicative value output means operates to set a value indicative of an output voltage corresponding to a supply voltage for the load, the DC-to-DC converter converts an output voltage of the battery in accordance with the output voltage indicative value. A voltage resulting from the conversion is applied to the load through an output voltage line.

SUMMARY OF THE INVENTION

In accordance with an aspect of the present invention, an electronic apparatus includes: a power supply unit, a power management unit, a display unit, a first interface for a secondary battery, and a separable battery device. The power management unit operates to cause information representative of a run time of the battery device to be indicated on the display unit. The battery device includes: a second interface for a secondary battery adapted to be coupled to the first interface, a rechargeable secondary battery adapted to supply power to the power supply unit, a fuel cell adapted to supply power to the power supply unit, and a battery run time computing unit receiving, from the secondary battery, data representative of a characteristic of voltage versus residual-capacity of the secondary battery, and receiving from the fuel cell, data representative of a residual capacity of the fuel cell. The battery run time computing unit determines data representative of a residual capacity of the secondary battery and a run time of the secondary battery in accordance with the data representative of the characteristic of voltage versus residual-capacity and with supply voltage and supply current of the secondary battery, determines a run time of the fuel cell in accordance with the data representative of the residual capacity of the fuel cell and with supply current of the fuel cell, and estimates which of power capacities of the secondary battery and the fuel cell reaches a corresponding one of predetermined residual capacities earlier. If it is estimated that the power capacity of the fuel cell reaches its predetermined residual capacity earlier, the battery run time computing unit determines a run time of the battery device, in accordance with the data representative of the secondary battery residual capacity, the data representative of the fuel cell residual capacity, and the supply currents of the secondary battery and of the fuel cell. If it is estimated that the power capacity of the secondary battery reaches its predetermined residual capacity earlier, the battery run time computing unit determines the run time of the battery device in accordance with the run time of the secondary battery. The battery run time computing unit supplies data representative of the thus determined run time of the battery device to the power management unit through the second interface and the first interface.

The invention also relates to a battery device for use in the electronic apparatus described above.

DESCRIPTION OF THE PREFERRED EMBODIMENTS

The use of a fuel cell unit in combination with a secondary battery unit for a notebook PC requires an interface between the notebook PC and the fuel cell unit, in addition to an interface between the notebook PC and the secondary battery unit. The additional interface should have a function of notifying a user of the residual power supply capacity. Then, the notebook PC requires dedicated hardware for a fuel cell. Accordingly an ordinary notebook PC cannot employ such a fuel cell unit.

An notebook PC with a fuel cell unit and a secondary battery unit may indicate the residual power capacities of a fuel cell and a secondary battery, but the actual run time depends on how the fuel cell and the secondary battery have been used, and cannot be directly proportional to the simple sum of the residual capacities. Hence it is difficult for users to estimate the run time, or how long the notebook PC can be operated.

An object of the present invention is to allow a DC power supply unit including a fuel cell to be connected to an existing electronic apparatus without providing modification to its interface.

Another object of the invention is to allow indication of the residual run time of a DC power supply unit including a fuel cell.

According to the invention, a DC power supply unit including a fuel cell can be connected to an existing electronic apparatus without providing modification to its interface, and the residual run time of a DC power supply unit including a fuel cell can be indicated.

The invention will be described in connection with non-limiting embodiments with reference to the accompanying drawings. Throughout the drawings, similar symbols and numerals indicate similar items and functions.

Figure 1:
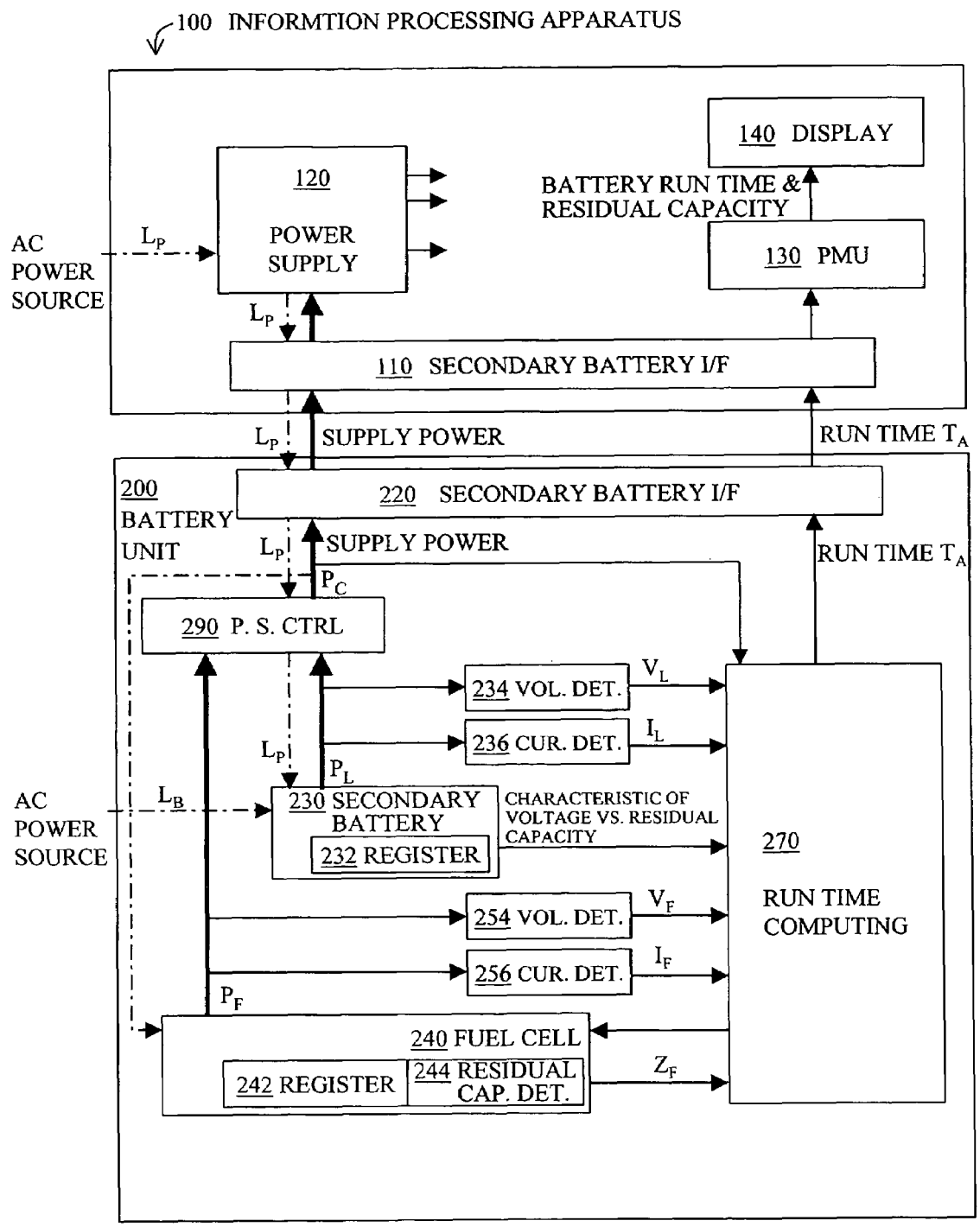
FIG. 1 shows a battery unit or battery pack for use in an electronic apparatus, such as a common information processing apparatus, in accordance with an embodiment of the present invention.

FIG. 1 shows a battery unit or battery pack 200 for use in an electronic apparatus, such as a common information processing apparatus 100, e.g. a notebook personal computer (PC), in accordance with an embodiment of the present invention.

The information processing apparatus 100 includes an interface (I/F) 110 for a secondary battery, a power supply unit 120 connected to the secondary battery interface 110, a power management unit (PMU) 130, and a display 140, which are elements associated with the battery unit 200. The power supply unit 120 supplies DC power to the elements of the information processing apparatus 100, including the power management unit 130 and the display 140.

The battery unit 200 includes a secondary battery interface 220, a rechargeable secondary battery 230 including a register 232, voltage and current detectors 234 and 236 for the secondary battery 230, a fuel cell or battery 240 including a register 242 and a residual capacity detector 244, voltage and current detectors 254 and 256 for the fuel cell 240, a battery run time computing unit 270 formed of, for example, a microcomputer, and a power supply control unit 290 coupled to power supply terminals $P_L$ and $P_F$ respectively of the secondary battery 230 and the fuel cell 240. The battery unit 200 may be a component included in the information processing apparatus 100. The secondary battery 230 is charged directly from an external commercial AC power source, as indicated by a dash-and-dot line $L_B$, or through the power supply unit 120, the secondary battery interfaces 110 and 220 and the power supply control unit 290 from an external commercial AC power source, as indicated by a dash-and-dot line $L_F$. The power supply control unit 290 has a power supply terminal $P_C$ coupled to an electric motor (not shown) in the fuel cell 240.

The secondary battery 230 and the fuel cell 240 supply DC power to the information processing apparatus 100 through the power supply control unit 290 and the secondary battery interface 220. The battery run time computing unit 270 operates with electric power supplied from a power supply terminal of the power supply control unit 290. Typically, the maximum current which the fuel cell 240 can supply is about 2 A.

The register 232 holds data related to the secondary battery 230, and the register 242 holds data related to the fuel cell 240. The battery run time computing unit 270 receives from the secondary battery 230, data representative of a table of a voltage versus residual-capacity characteristic of the secondary battery 230, and also receives data $Z_F$ representative of the residual capacity of the fuel cell 240. Further, the battery run time computing unit 270 receives, from the voltage detector 234 and the current detector 236, data representative of a voltage $V_L$ and a current $I_L$ at the power supply terminal $P_L$ of the secondary battery 230, and also receives, from the voltage detector 254 and the current detector 256, data representative of a voltage $V_F$ and current $I_F$ at the power supply terminal $P_F$ of the fuel cell 240.

Figure 2:
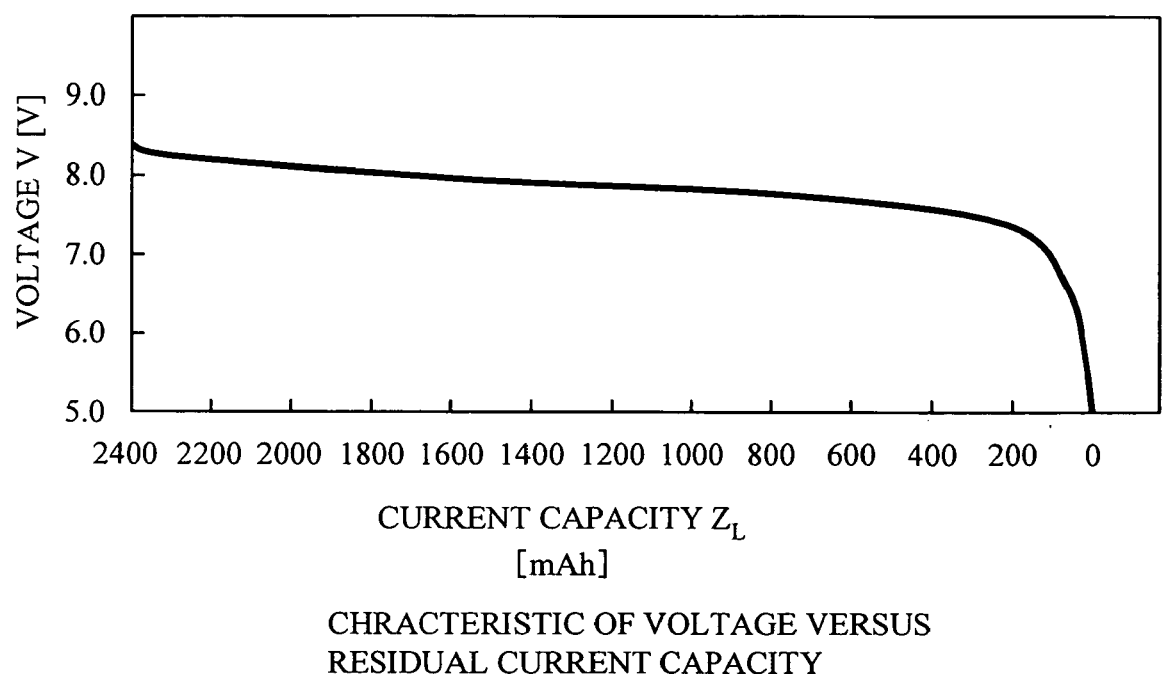
FIG. 2 illustrates the voltage versus residual-capacity characteristic curve of a secondary battery.

FIG. 2 illustrates the voltage versus residual-capacity characteristic curve of the secondary battery 230. A table of data representative of this voltage versus residual-capacity characteristic curve is stored in the register 232 of the secondary battery 230. The residual capacity, i.e. residual current supply capacity, $Z_L$, is expressed by the product of current and time.

The battery run time computing unit 270 computes an estimated residual run time $T_A$ of the battery unit 200 from the information it has taken in, and provides data representative of the estimated residual run time $T_A$ to the information processing apparatus 100 through the secondary battery interface 220.

In the information processing apparatus 100, the power received through the secondary battery interface 110 is supplied to the power supply unit 120, and the data related to the residual run time $T_A$ received through the secondary battery interface 110 is coupled to the power management unit 130. The power management unit 130 processes the data related to the residual run time $T_A$, and causes the run time $T_A$ to be indicated on the display 140.

Figure 3:
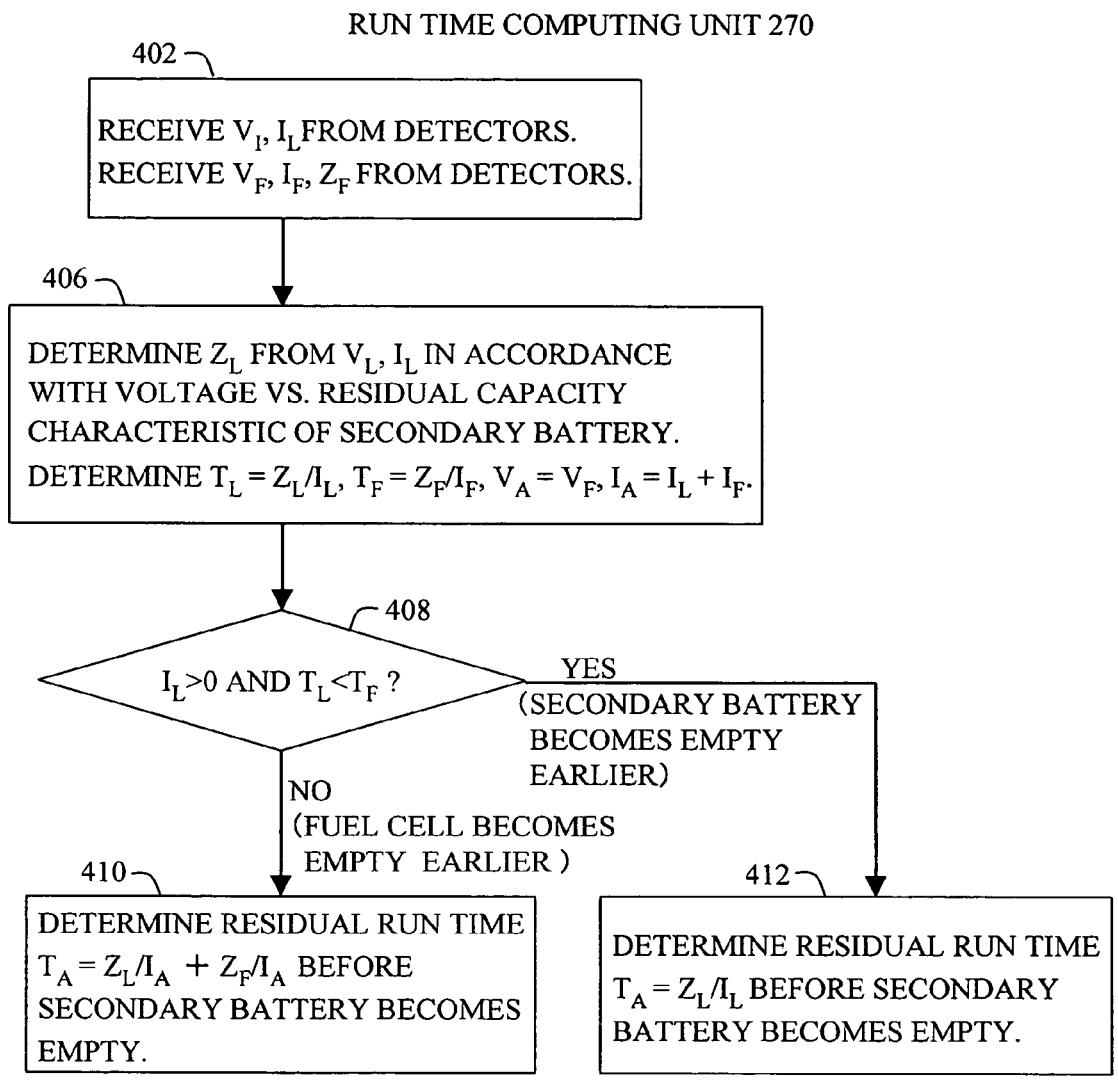
FIG. 3 is a flow chart of the computation of the estimated residual run time, which is performed by a battery run time computing unit during the operation of the information processing apparatus.

FIG. 3 is a flow chart of the computation of the estimated residual run time $T_A$, which is performed by the battery run time computing unit 270 during the operation of the information processing apparatus 100. The flow chart is reiteratively executed during the operation of the information processing apparatus 100.

Referring to FIG. 3, at Step 402, the run time computing unit 270 receives data representative of the voltage $V_L$ and current $I_L$ at the power supply terminal $P_L$ of the secondary battery 230 from the voltage detector 234 and the current detector 236, respectively, and also receives data representative of the voltage $V_F$ and current $I_F$ at the power supply terminal $P_F$ of the fuel cell 240 from the voltage detector 254 and the current detector 256, respectively, and the residual capacity $Z_F$ of the fuel cell 240 from the residual capacity detector 244. The residual capacity $Z_F$ represents the current capacity, or current-time, corresponding to the residual amount of the volume of the fuel of the fuel cell 240. At Step 406, the run time computing unit 270 determines the residual capacity $Z_L$ of the secondary battery 230 in accordance with the voltage $V_L$ and current $I_L$ received from the secondary battery 230 and with the table of data representative of the voltage versus residual-capacity characteristic received from the secondary battery 230. The residual capacity $Z_L$ represents the residual current capacity, or current-time, of the secondary battery 230. After that, the battery run time computing unit 270 determines the residual run time $T_L$ of the secondary battery 230, the residual run time $T_F$ of the fuel cell 240, and the voltage $V_A = V_F$ and current $I_A$ of the battery unit 200. The residual run time $T_L$ of the secondary battery 230 is equal to the residual capacity $Z_L$ divided by the current $I_L$, i.e. $T_L = Z_L/I_L$. The residual run time $T_F$ of the fuel cell 240 is equal to the residual capacity $Z_F$ divided by the current $I_F$, i.e.

$T_F=Z_F/I_F$. The current $I_A$ of the battery unit 200 is the sum of the currents of the secondary battery 230 and fuel cell 240, i.e. $I_A=I_L+I_F$.

At Step 408, the battery run time computing unit 270 determines whether the current value $I_L$ satisfies a condition of $I_L>0$, and whether the respective residual run times $T_L$ and $T_F$ of the secondary battery 230 and fuel cell 240, respectively, satisfy a condition of $T_L<T_F$. If it is determined that these conditions are satisfied, it can be assumed that the residual capacity of the secondary battery 230 will reach a predetermined value for which an indication of "empty" is indicated, earlier than the residual capacity of the fuel cell 240. Then, at Step 412, the battery run time computing unit 270 determines the residual run time $T_A=Z_L/I_L$, at the end of which the secondary battery 230 reaches the predetermined value for the indication of "empty". If it is determined at Step 408 that the conditions are not satisfied, it can be assumed that the residual capacity of the fuel cell 240 will reach a predetermined value for which an indication of "empty" is indicated, earlier than the secondary battery 230. Then, at Steps 410, the battery run time computing unit 270 determines the residual run time $T_A=Z_L/I_A+Z_F/I_A$, at the end of which the secondary battery 230 reaches the predetermined value for the indication of "empty". The battery run time computing unit 270 provides data representative of the residual run time $T_A$ of the battery unit 200 to the information processing apparatus 100 through the secondary battery interface 220. If the fuel cell 240 is of an active type, it requires power to be supplied from the secondary battery when the fuel cell 240 is activated, and hence a predetermined small amount of residual capacity of the secondary battery 230 is treated as "empty" to be indicated on the display. On the other hand, if the fuel cell 240 is of a passive type, it need not be powered from the secondary battery 230 upon activation. Accordingly, the zero residual capacity of the secondary battery 230 may be treated as the empty state on the display. Typically, the zero residual capacity of the fuel cell 240 may be treated as the empty state of the fuel cell 240 to be indicated on the display.

Figure 4:
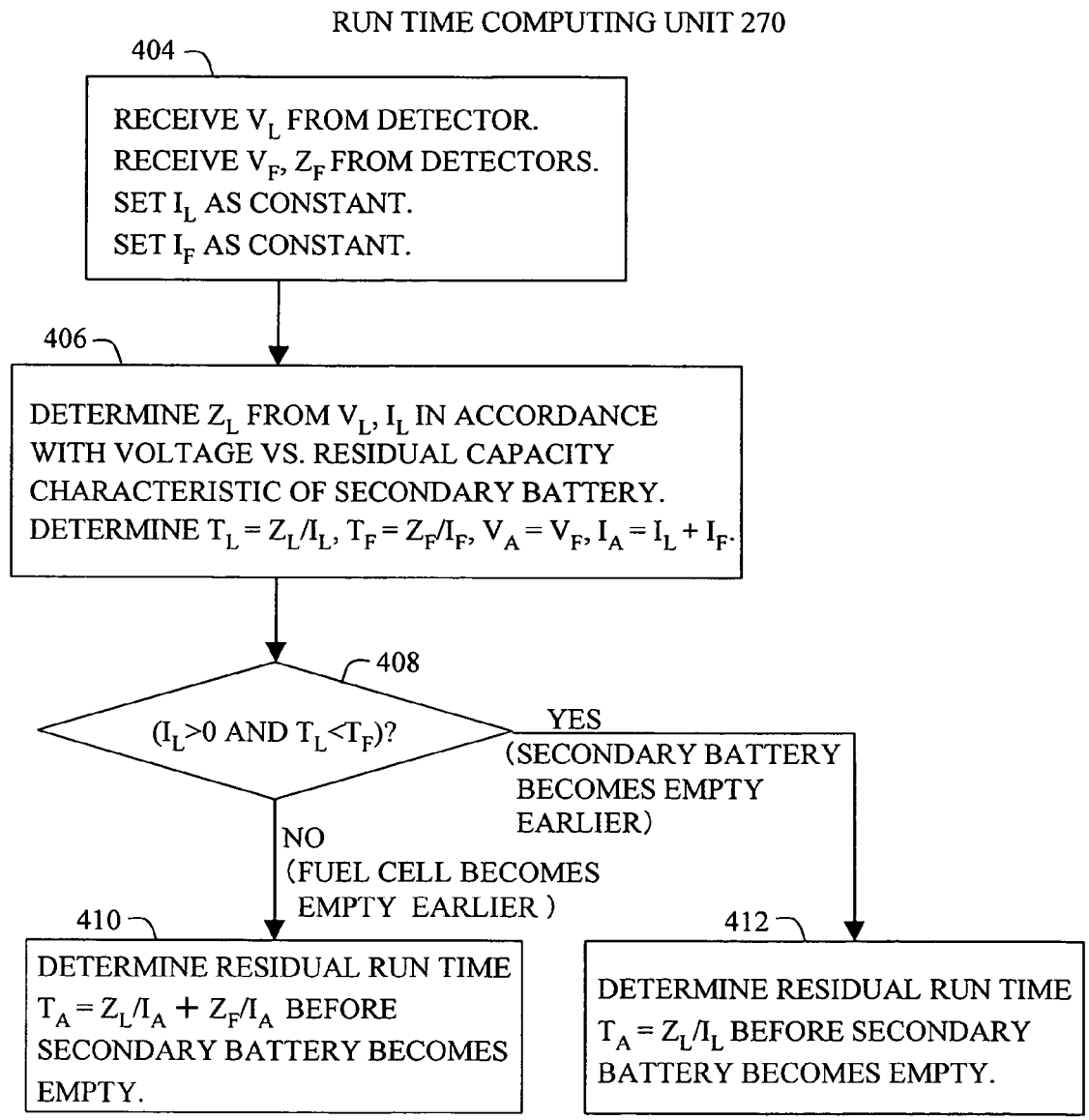
FIG. 4 is a flow chart of the computation of the estimated residual run time, which is executed by the battery run time computing unit during a period when the information processing apparatus is not operating.

FIG. 4 is a flow chart of the computation of the estimated residual run time $T_A$, which is executed by the battery run time computing unit 270 during a period when the information processing apparatus 100 is not operating.

Referring to FIG. 4, at Step 404, the battery run time computing unit 270 receives, from the voltage detector 234, data representative of the voltage $V_L$ at the power supply terminal $P_L$ of the secondary battery 230, receives, from the voltage detector 254 and the residual capacity detector 244, data representative of the voltage $V_F$ at the power supply terminal $P_F$ of the fuel cell 240 and the residual capacity $Z_F$ of the fuel cell 240, and assumes that the current value $I_L$ at the power supply terminal $P_L$ of the secondary battery 230 and the current value $I_F$ at the power supply terminal $P_F$ of the fuel cell 240 are respectively predetermined fixed values. The fixed values of the currents $I_L$ and $I_F$ may be respective estimated average consumption currents in the information processing apparatus 100, or may be the values of the currents as detected in the operating state immediately preceding the present halt state. Steps 406-412 are the same as those of FIG. 3, and hence are not described again.

As described, the battery unit 200 including the fuel cell 240 can be used with an ordinary information processing apparatus 100 having an ordinary secondary battery interface 110, without need for making any modifications thereto.

Figure 5:
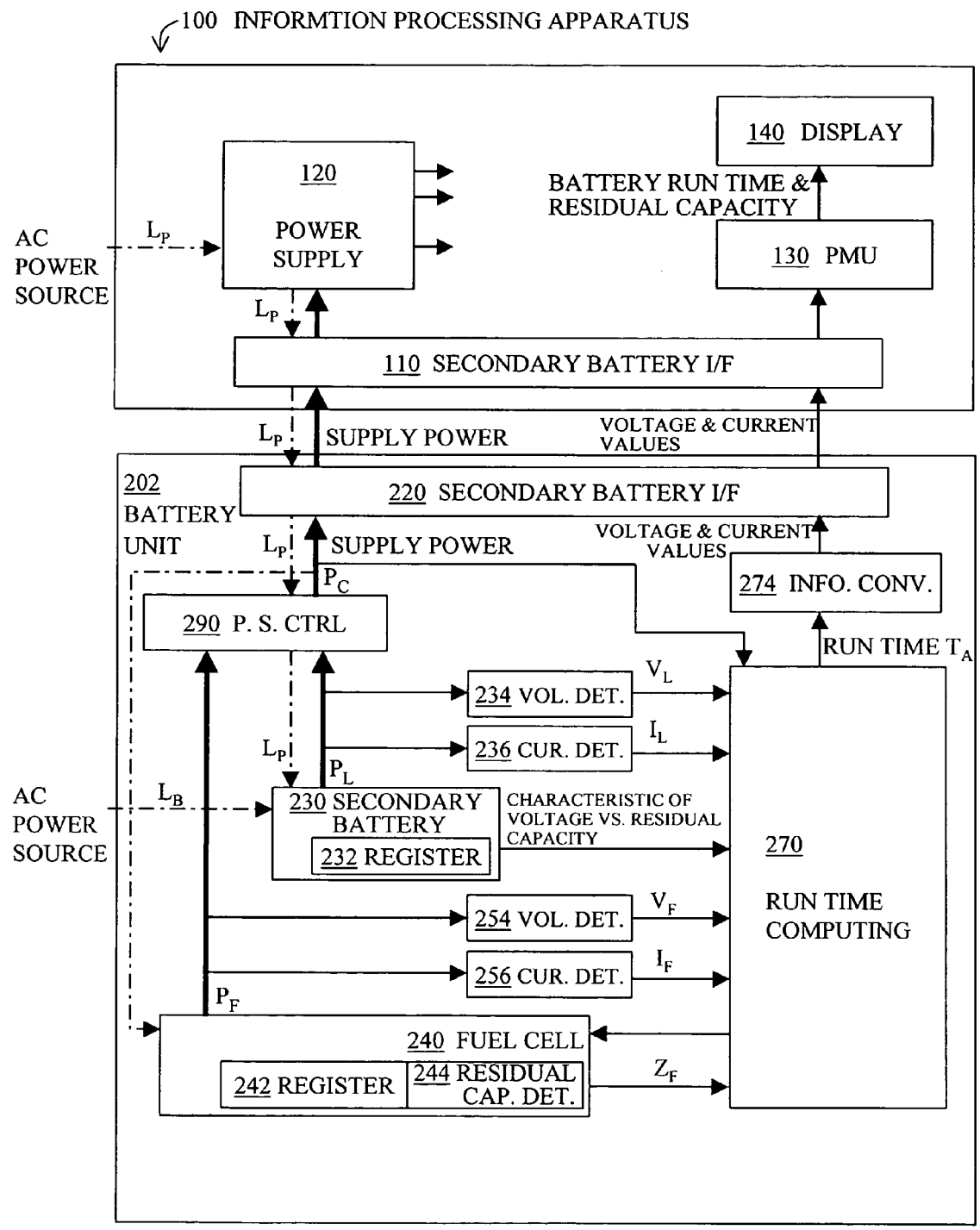
FIG. 5 shows a battery unit, which is used with an electronic apparatus, such as an ordinary information processing apparatus, in accordance with another embodiment of the invention.

FIG. 5 shows a battery unit 202, which is used with an electronic apparatus, such as an ordinary information processing apparatus 100, in accordance with another embodiment of the invention. In addition to the elements of the battery unit 200 shown in FIG. 1, the battery unit 202 has an information converting unit 274, which receives the run time $T_A$ from a battery run time computing unit 270. The other elements of the battery unit 202 are the same as those of the battery unit 200 of FIG. 1.

In an ordinary notebook PC, a voltage VL and a current $I_L$ received from a secondary battery unit are converted to a residual battery current capacity $Z_L$ and a battery run time $T_L$ in accordance with a table of data representative of a voltage versus residual-capacity characteristic received from the secondary battery unit. In accordance with this embodiment, it is made possible for the residual battery capacity $Z_A$ and run time $T_A$ of the novel battery unit 202 to be indicated on a display 140, without making modifications to the structure of the ordinary information processing apparatus 100 per se.

The information converting unit 274 receives the table of data representative of the voltage versus residual-capacity characteristic of the secondary battery 230 stored in the register 232 directly or via the battery run time computing unit 270 from a secondary battery 230. The information converting unit 274 converts the run time $T_A$ to the voltage value $V_A$ and current value $I_A$ in accordance with the table of data representative of the voltage versus residual-capacity characteristic. The voltage value $V_A$ and the current value $I_A$ are supplied to the information processing apparatus 100 through the secondary battery interface 220.

Figure 6:
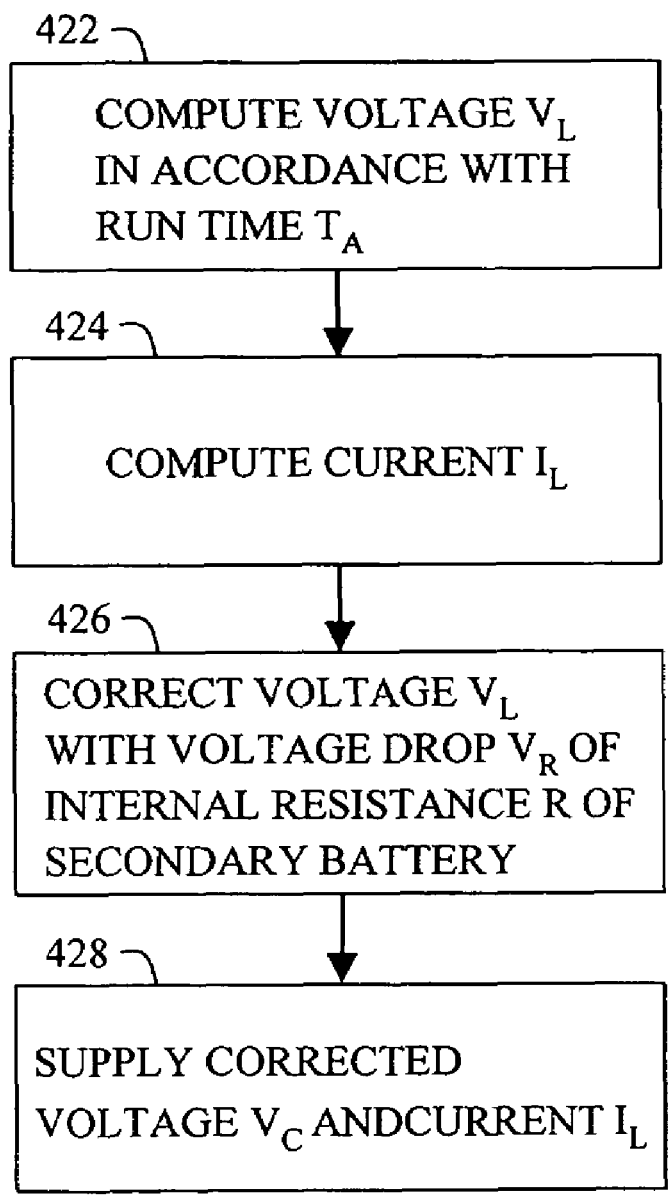
FIG. 6 is a flow chart of the conversion of the residual run time to the voltage and current, which is executed by the information converting unit.

FIG. 6 is a flow chart of the conversion of the residual run time $T_A$ to the voltage $V_A$ and current $I_A$, which is executed by the information converting unit 274.

Referring to FIG. 6, at Step 422, the information converting unit 274 maps the range between the maximum and minimum values of the run time $T_A$ of the battery unit 202 proportionally onto the range between the maximum and minimum values of the residual current capacity $Z_L$ in the table representative of voltage versus residual-capacity characteristic (FIG. 2) of the secondary battery 230, and, in accordance with the mapped relationship, further maps the present estimated residual run time $T_A$ to the corresponding residual current capacity $Z_L$ of the secondary battery 230, to determine the voltage value $V_L$ corresponding to that current capacity $Z_L$ based on the table representative of voltage versus residual-capacity characteristic. At Step 424, the information converting unit 274 determines the current capacity $Z_L$ corresponding to the voltage $V_L$, and determines the current $I_L$ in accordance with the current capacity $Z_L$ and the run time $T_A$. (Current $I_L$=Current Capacity $Z_L$/Run time $T_A$.)

At Step 426, the information converting unit 274 determines, in accordance with the current $I_L$, a voltage drop $V_R$ developed due to the internal resistance R of the secondary battery 230 in order to compensate for this voltage drop $V_R$, and determines a compensation voltage value $V_C$ by subtracting the voltage drop $V_R$ from the voltage $V_L$. At Step 428, the information converting unit 274 supplies the current value $I_L$ and the corrected voltage value $V_C$ to the information processing apparatus 100 via the secondary battery interface 220.

In the information processing apparatus 100, the corrected voltage value $V_C$ and the current value $I_L$ received through the secondary battery interface 110 are supplied to the power management unit 130. The power management unit 130 converts the voltage value $V_C$ and the current value $I_L$, in accordance with the table of data representative of the voltage versus residual-capacity characteristic of the secondary battery 230, to the residual battery power capacity $Z_L$, i.e. $Z_A$, and to the residual run time $T_L$, i.e. $T_A$, and indicates the residual battery capacity $Z_A$ and the residual run time $T_A$ of the battery unit 202 on the display 140.

Figure 7:
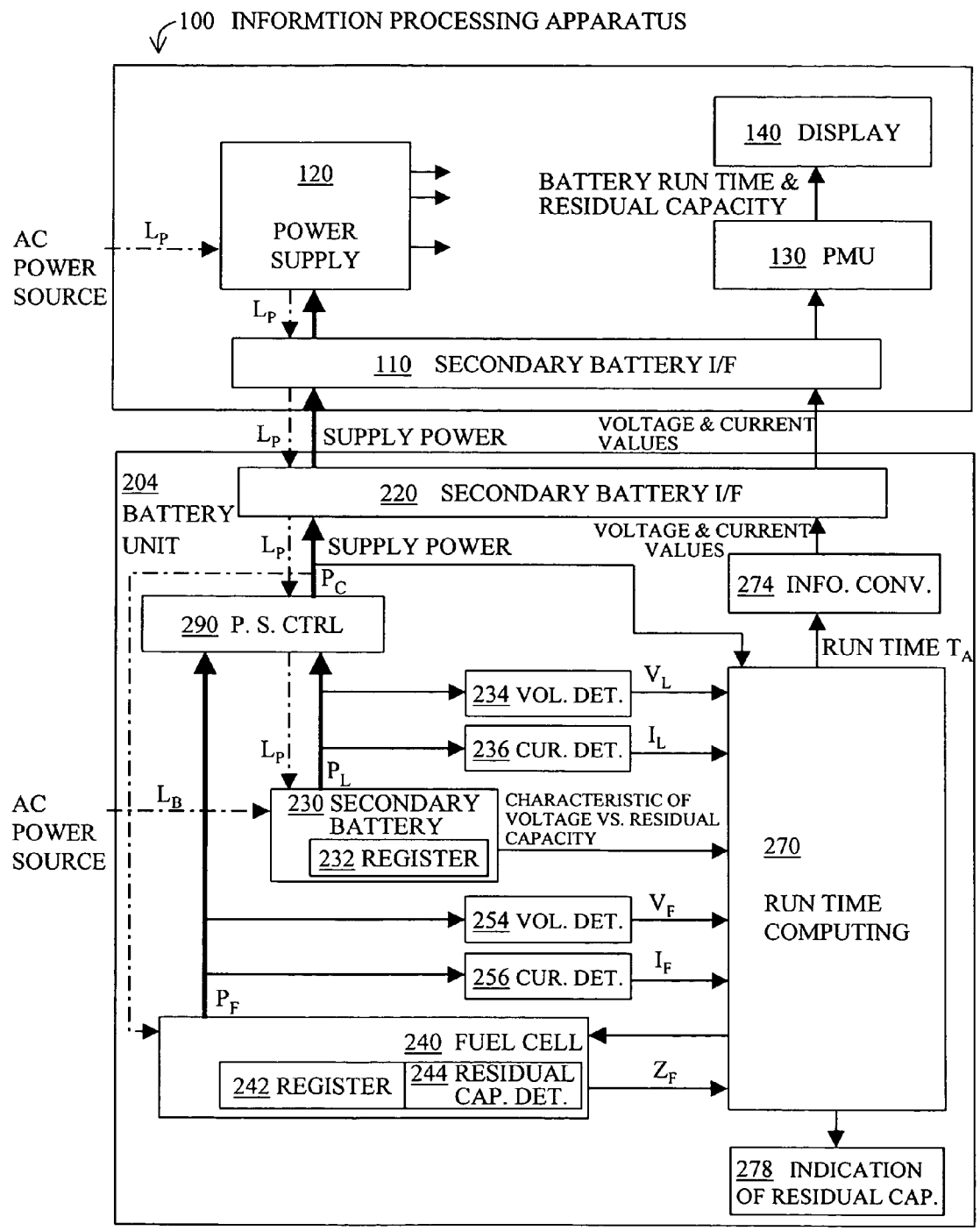
FIG. 7 shows a battery unit for use with an electronic apparatus, such as an ordinary information processing apparatus, in accordance with a further embodiment of the invention.

FIG. 7 shows a battery unit 204 for use with an electronic apparatus, such as an ordinary information processing apparatus 100, in accordance with a further embodiment of the invention. The battery unit 204 has a residual battery capacity indication unit 278 connected to the battery run time computing unit 270. The other elements of the battery unit 204 are the same as those of the battery unit 202 shown in FIG. 5. The battery run time computing unit 270 causes the battery capacity indication unit 278 to indicate the residual capacity $Z_F$ of the fuel cell 240 and the residual capacity $Z_L$ of the secondary battery 230, a charging waiting time, a useable time set by a user, and the like.

Figure 8A:
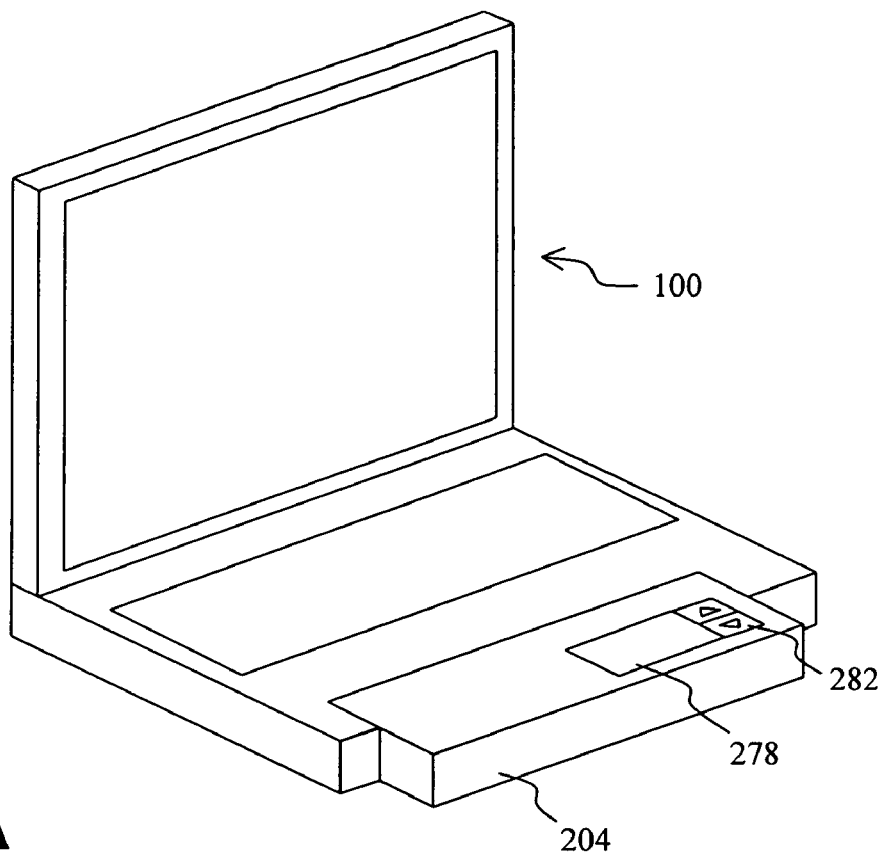
FIG. 8A shows the information processing apparatus to which the battery unit having the battery capacity indication unit is attached.
Figure 8B:
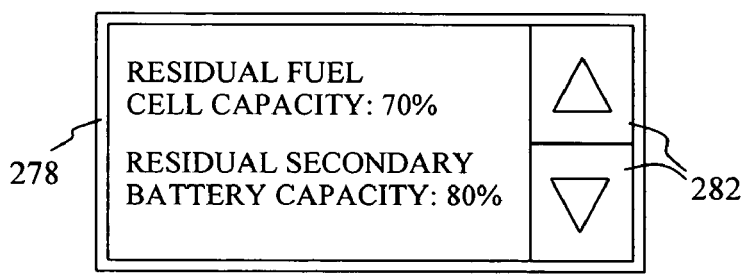
FIGS. 8B and 8C show examples of indication indicated by the battery capacity indication unit.
Figure 8C:
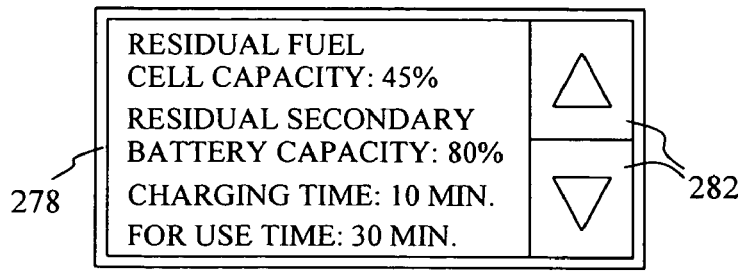

FIG. 8A shows the information processing apparatus 100 to which the battery unit 204 having the battery capacity indication unit 278 is attached. FIGS. 8B and 8C show examples of indication indicated by the battery capacity indication unit 278. The battery capacity indication unit 278 has setting buttons 282 operated by a user, who can use the buttons 282 to select items to be indicated on the battery capacity indication unit 278.

The battery capacity indication unit 278 shown in FIG. 8B, indicates the "residual fuel cell capacity" and the "residual secondary battery capacity" in percent as computed by the battery run time computing unit 270 in accordance with the residual capacities $Z_F$ and $Z_L$. The battery capacity indication unit 278 shown in FIG. 8C, indicates the "residual fuel cell capacity", the "residual secondary battery capacity", the "charging time" representative of waiting time required for charging for a set use time, and the set "use time". The use time is set through the operation of the buttons 282. In the case shown in FIG. 8C, it is shown that the charging for the run time of thirty (30) minutes will be completed ten (10) minutes later.

Figure 9:
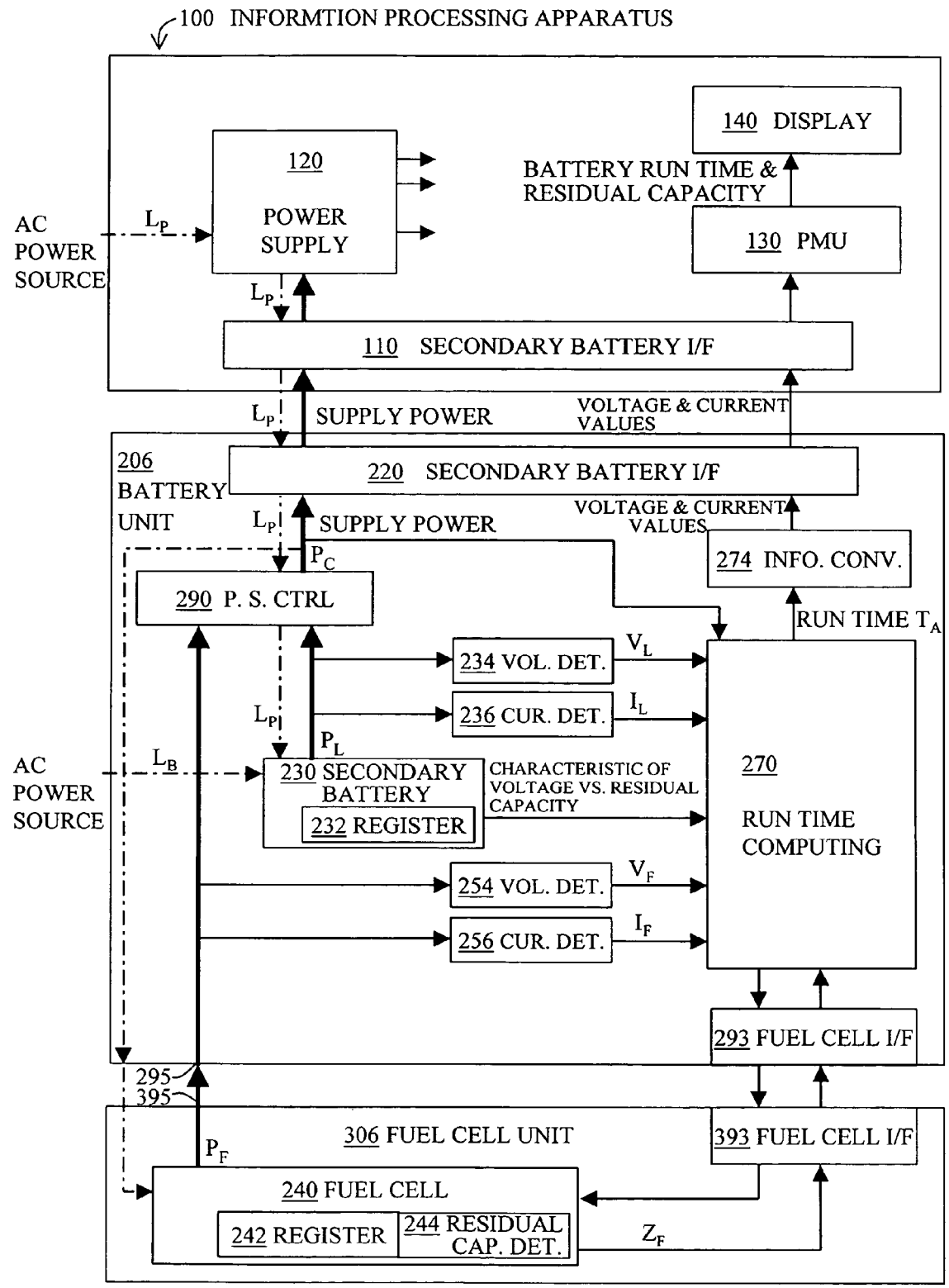
FIG. 9 shows a battery unit and a separate fuel cell unit for use with an electronic apparatus, such as an ordinary information processing apparatus, in accordance with a still further embodiment of the invention.

FIG. 9 shows a battery unit 206 and a separate fuel cell unit 306 for use with an electronic apparatus, such as an ordinary information processing apparatus 100, in accordance with a still further embodiment of the invention. The battery unit 206 includes the secondary battery interface 220, the secondary battery 230, the voltage and current detectors 234 and 236 for the secondary battery 230, the voltage and current detectors 254 and 256 for the fuel cell 240, the battery run time computing unit 270, the power supply control unit 290 coupled to the power supply terminal $P_L$ of the secondary battery 230 and to an external power supply terminal 295, and a fuel cell interface (I/F) 293, and may further include a residual battery capacity indication unit 278 (not shown) coupled to the battery run time computing unit 270 similarly to that of FIG. 7. The fuel cell unit 306 includes a fuel cell 240 with a register 242 and a residual capacity detector 244, and a fuel cell interface (I/F) 393. The battery unit 206 does not include the fuel cell 240. The power supply terminal $P_L$ of the secondary battery 230 is connected also to an electric motor (not shown) for the fuel cell 240. The elements 220-274 are similar to those shown in FIG. 5 having the same reference numerals.

A power supply terminal 395 of the fuel cell unit 306 is connected to the power supply terminal 295 of the battery unit 206, through which it is connected to the power supply control unit 290, the voltage detector 254 and the current detector 256 in the battery unit 206. The size of a case for the fuel cell unit 306 is large, and hence the case of the fuel cell unit 306 is adapted to form a discrete case and be separable from the case of the battery unit 206, so that the fuel cell unit 306 can be dissociated when it is not used.

Figure 10:
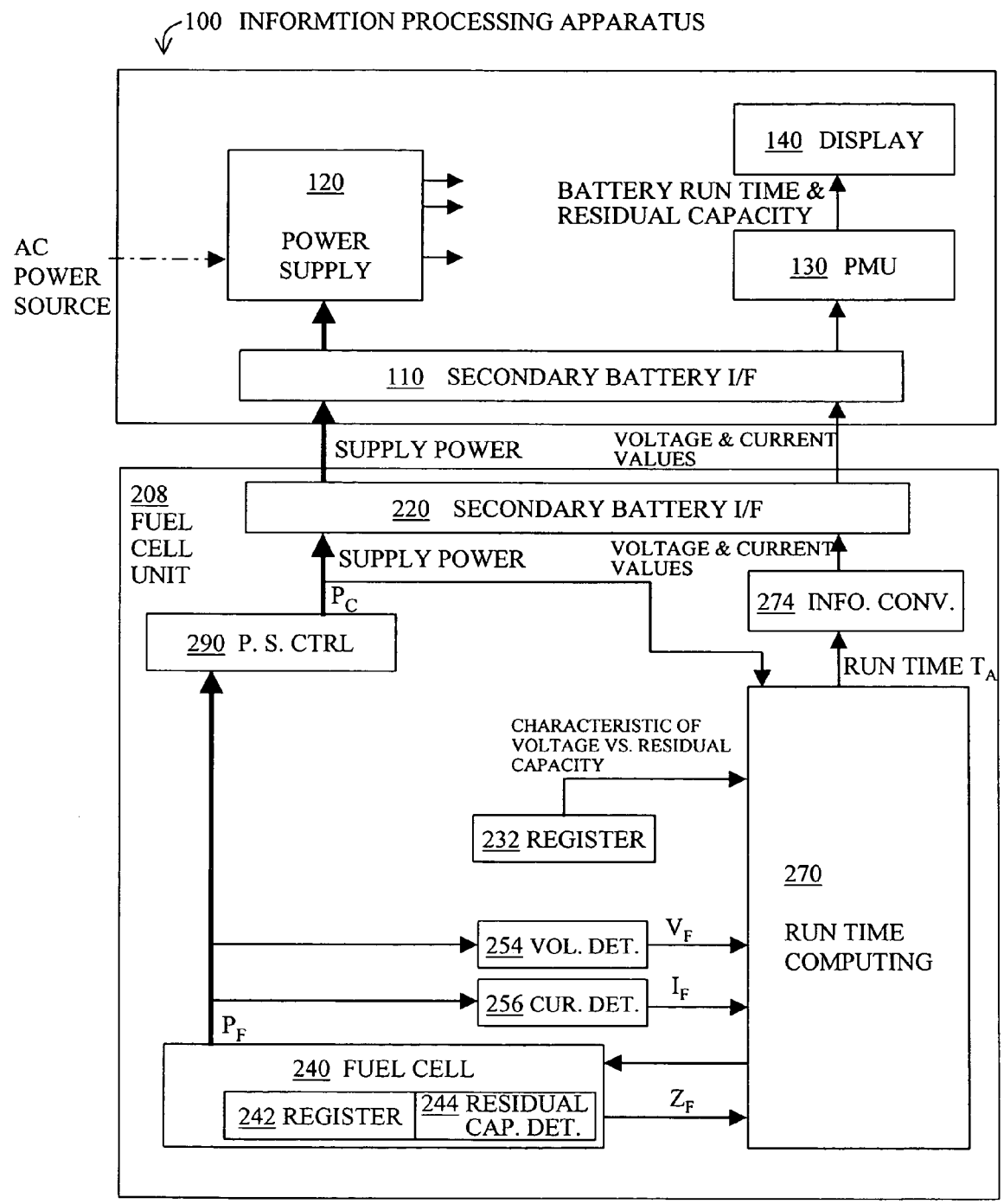
FIG. 10 shows a fuel cell unit for use with an electronic apparatus, such as an ordinary information processing apparatus, in accordance with a still further embodiment of the invention.

FIG. 10 shows a fuel cell unit 208 for use with an electronic apparatus, such as an ordinary information processing apparatus 100, in accordance with a still further embodiment of the invention. The fuel cell unit 208 includes the secondary battery interface 220, a register 232 storing therein data relating to an ordinary secondary battery, the fuel cell 240 including the register 242 and the residual capacity detector 244, the voltage and current detectors 254 and 256 for the fuel cell 240, the battery run time computing unit 270, and the power supply control unit 290 coupled to the power supply terminal of the fuel cell 240. The fuel cell unit 208 does not include a secondary battery, a secondary battery voltage detector, or a secondary battery current detector. The other elements of the fuel cell unit 208 are the same as the corresponding elements of the battery unit 202 shown in FIG. 5. This embodiment is for a case in which the fuel cell 240 can provide a sufficiently large current without the aid of a secondary battery. The fuel cell unit 208 may be of an active type with a small capacity secondary battery incorporated thereinto, or may be of a passive type with no secondary battery or electric motor.

Figure 11:
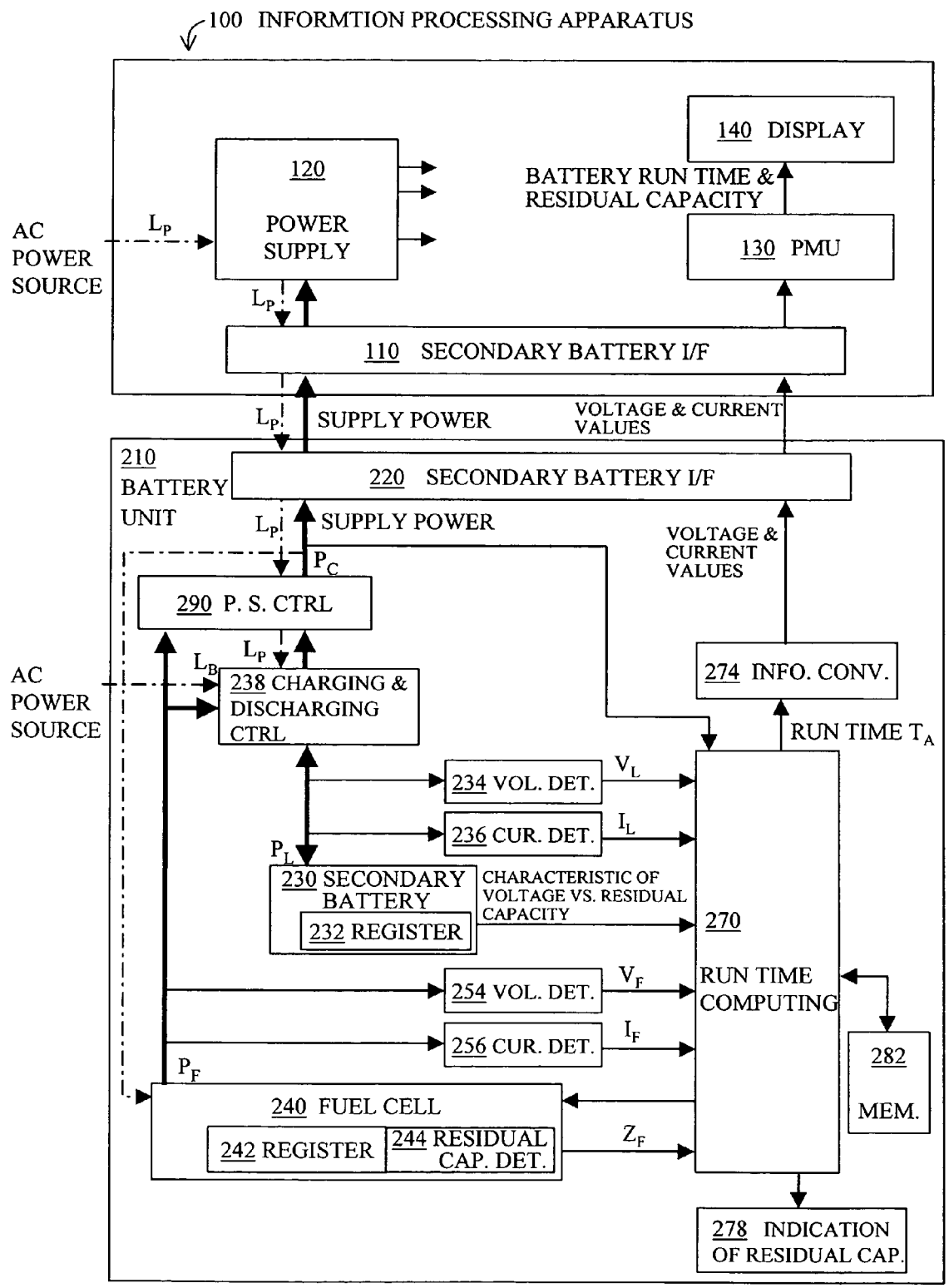
FIG. 11 shows a battery unit for use with an electronic apparatus, such as an ordinary information processing apparatus, in accordance with a still further embodiment of the invention.

FIG. 11 shows a battery unit 210 for use with an electronic apparatus, such as an ordinary information processing apparatus 100, in accordance with a still further embodiment of the invention. The battery unit 210 includes, in addition to the elements of the battery unit 202 shown in FIG. 5, a charging and discharging control unit 238 for controlling to charge and discharge the secondary battery 230, and a memory unit 282 connected to the battery run time computing unit 270.

The charging and discharging control unit 238 is connected between the power supply terminal $P_F$ of the fuel cell 240 connected to the power supply control unit 290 and the power supply terminal $P_L$ of the secondary battery 230 connected to the power supply control unit 290. The charging and discharging control unit 238 provides control to switch the secondary battery 230 between charging and discharging. The charging and discharging control unit 238 causes the secondary battery 230 to be charged as much as possible from power or residual power of the fuel cell 240 when the information processing apparatus 100 is not operating or is operable only from the power supply from the fuel cell 240.

The memory 282 holds a detected current value of the secondary battery 230 and a detected current value of the fuel cell 240. Since the battery run time computing unit 270 cannot detect current when the information processing apparatus 100 is not operating, it uses the detected current values $I_L$ and $I_F$ previously held in the memory unit 282 in computing the estimated residual run time $T_A$ of the battery unit 203. It should be noted that, instead of the detected current values $I_L$ and $I_F$, predetermined values may be used. The other elements of the battery unit 210 are the same as those of the battery unit 202 shown in FIG. 5.

Figure 12:
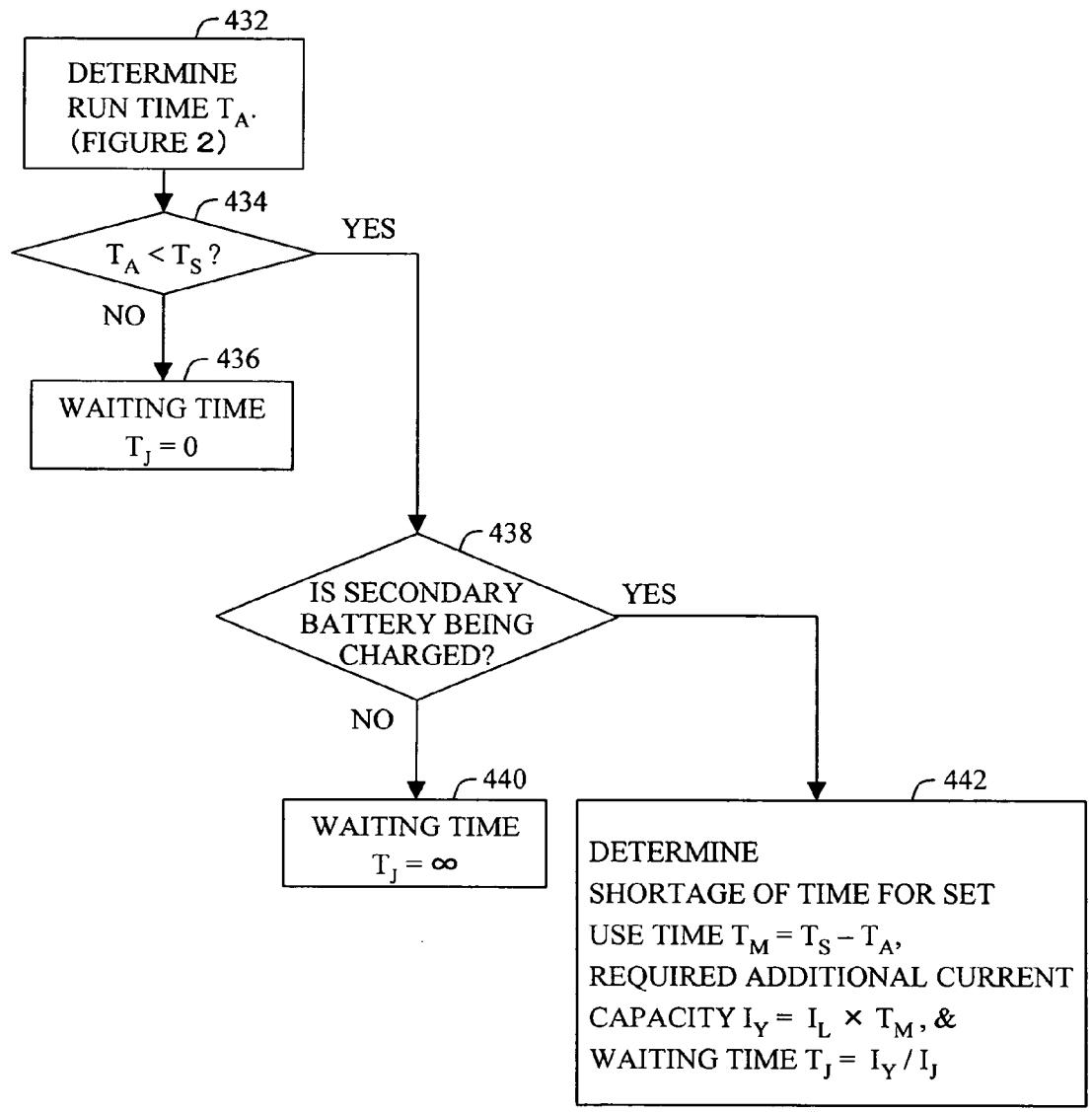
FIG. 12 is a flow chart of the computation of the waiting time before the battery power capacity for the use time period set by a user can be attained during charging of the secondary battery, which is executed by the battery run time computing unit of the battery unit shown in FIG. 11.

FIG. 12 is a flow chart of the computation of the waiting time before the battery power capacity for the use time period set by a user can be attained during charging of the secondary battery 230, which is executed by the battery run time computing unit 270 of the battery unit 210 shown in FIG. 11.

Referring to FIG. 12, at Step 432, the battery run time computing unit 270 determines the residual run time $T_A$ in accordance with the flow chart shown in FIG. 2. At Step 434, the battery run time computing unit 270 determines whether the run time $T_A$ is shorter than a set use time $T_S$. If it is determined that the run time $T_A$ is not shorter than the set use time $T_S$, the battery run time computing unit 270 at Step 436 determines that the waiting time $T_J$ is zero (0) minutes. If it is determined that the run time $T_A$ is shorter than the set use time $T_S$, the battery run time computing unit 270 at Step 438 determines as to whether the secondary battery is being charged. If it is determined that the secondary battery 230 is not being charged, the battery run time computing unit 270 at Step 440 determines that the waiting time $T_J$ is infinite ($T_J=\infty$).

If it is determined at Step 438 that the secondary battery 230 is being charged, the battery run time computing unit 270 at Step 442 computes the shortage of time, $T_M$, for the set use time $T_S$, which is the difference between the set use time $T_S$ and the run time $T_A$, i.e. $T_M=T_S-T_A$, then, computes the additional current capacity required for charging, which is the product of the current $I_L$ of the secondary battery 230 and the time shortage $T_M$, i.e. $I_Y=I_L\times T_M$, and, then, computes the waiting time, which is the quotient of the additional current capacity $I_Y$ divided by a detected charge current $I_J$, i.e. $T_J=I_Y/I_J$. The thus determined waiting time $T_J$ is indicated on the battery capacity indication unit 278 as shown in FIG. 8C.

According to the embodiments described in detail above, the fuel cell can be used with the electronic apparatus, such as a conventional information processing apparatus, without need for modifying the interface of the electronic apparatus, and also the residual run time of the battery unit can be indicated.

The above-described embodiments are only typical examples, and their combination, modifications and variations are apparent to those skilled in the art. It should be noted that those skilled in the art can make various modifications to the above-described embodiments without departing from the principle of the invention and the accompanying claims.

What is claimed is:

1. An electronic apparatus comprising: a power supply unit, a power management unit, a display unit, a first secondary battery interface, and a separable battery device, wherein:
    said power management unit causes information representative of a run time of said separable battery device to be indicated on said display unit, and
    said separable battery device comprises:
        a rechargeable secondary battery adapted to supply power to said power supply unit,
        a second secondary battery interface, coupled to said first interface,
        a fuel cell to supply power to said power supply unit, and
        a battery run time computing unit receiving, from said rechargeable secondary battery, data representative of a characteristic of voltage versus residual-capacity of said rechargeable secondary battery and receiving, from said fuel cell, data representative of a residual capacity of said fuel cell, wherein:
        said battery run time computing unit determines data representative of a residual capacity of said rechargeable secondary battery and a run time of said rechargeable secondary battery in accordance with said data representative of the characteristic of voltage versus residual-capacity and with supply voltage and supply current of said rechargeable secondary battery, determines a run time of said fuel cell in accordance with said data representative of the residual capacity of said fuel cell and with supply current of said fuel cell, and estimates which of the respective power capacities of said rechargeable secondary battery and said fuel cell reaches a corresponding one of the respective, predetermined residual capacities earlier,
        if it is estimated that the power capacity of said fuel cell reaches its predetermined residual capacity earlier, said battery run time computing unit determines a run time of said separable battery device, in accordance with said data representative of the rechargeable secondary battery residual capacity, said data representative of the fuel cell residual capacity, and said respective supply currents of said rechargeable secondary battery and of said fuel cell,
        if it is estimated that the power capacity of said rechargeable secondary battery reaches its predetermined residual capacity earlier, said battery run time computing unit determines the run time of said separable battery device in accordance with the run time of said rechargeable secondary battery, and
        said battery run time computing unit supplies data representative of the thus determined run time of said separable battery device to said power management unit through said second secondary battery interface and said first interface.

2. The electronic apparatus according to claim 1, wherein said power management unit causes said data representative of the determined run time of said separable battery device to be indicated on said display unit, as information representative of the run time of said separable battery device.

3. The electronic apparatus according to claim 1, wherein said separable battery device comprises further a first detector for detecting the supply voltage and current from said rechargeable secondary battery, and a second detector for detecting the supply current of said fuel cell; and
    said battery run time computing unit determines the respective run times of said rechargeable secondary battery and of said fuel cell, in accordance with the supply current values detected by said first and second detectors, when said electronic apparatus is operating, and
    said battery run time computing unit determines the respective run times of said rechargeable secondary battery and of said fuel cell, in accordance with predetermined supply current values, when said electronic apparatus is not operating.

4. The electronic apparatus according to claim 1, wherein said separable battery device comprises further an information converting unit converting, in accordance with said data representative of the characteristic of voltage versus residual-capacity, data representative of the determined run time of said separable battery device into corresponding voltage and current values of said rechargeable secondary battery.

5. The electronic apparatus according to claim 1, wherein said separable battery device comprises, further, a residual capacity indication unit indicating one or both of the residual capacities of said rechargeable secondary battery and of said fuel cell.

6. The electronic apparatus according to claim 1, wherein said separable battery device includes a first portion connectable to said electronic apparatus, and a second portion connectable to said first portion,
    said first portion including said second secondary battery interface and said battery run time computing unit,
    said second portion including said fuel cell and being separable from said first portion.

7. The electronic apparatus according to claim 1, wherein said separable battery device comprises further a charging and discharging control unit controlling charging of said rechargeable secondary battery from said fuel cell; and
    said battery run time computing unit computes a time required for charging said rechargeable secondary battery from said fuel cell to a level required for said electronic apparatus to operate for a given time period.

8. An electronic apparatus, comprising:
    a power supply unit, a power management unit, a display unit, a first interface for a rechargeable secondary battery, and a separable fuel cell device, wherein:
    said power management unit operates to cause information representative of a run time of said fuel cell device to be indicated on said display unit;
    said fuel cell device comprises:

a second interface for a rechargeable secondary battery, said second interface being adapted to be coupled to said first interface, a storage device storing therein data representative of the rechargeable secondary battery characteristic of voltage versus residual-capacity, a fuel cell adapted to supply power to said power supply unit, and a fuel cell run time computing unit receiving, from said storage device, said data representative of the characteristic of voltage versus residual-capacity, and receiving, from said fuel cell, data representative of a residual capacity of said fuel cell, wherein said fuel cell run time computing unit determines a run time of said fuel cell in accordance with said data representative of the fuel cell residual capacity and with a supply current of said fuel cell, and supplies data representative of the determined run time of said fuel cell to said power management unit via said second secondary battery interface and said first interface.

9. A separable battery device connectable to supply power to an electronic apparatus, said separable battery device, comprising:

a rechargeable secondary battery adapted to supply power to said electronic apparatus, an interface for said rechargeable secondary battery, said interface being adapted to interface with said electronic apparatus, a fuel cell adapted to supply power to said electronic apparatus, and a battery run time computing unit receiving, from said rechargeable secondary battery, data representative of a characteristic of voltage versus residual-capacity of said rechargeable secondary battery, and receiving from said fuel cell, data representative of a residual capacity of said fuel cell, wherein:

said battery run time computing unit determines data representative of a residual capacity of said rechargeable secondary battery and a run time of said rechargeable secondary battery in accordance with said data representative of the characteristic of voltage versus residual-capacity and with supply voltage and supply current of said rechargeable secondary battery, determines a run time of said fuel cell in accordance with said data representative of the residual capacity of said fuel cell and with supply current of said fuel cell, and estimates which of respective power capacities of said rechargeable secondary battery and said fuel cell reaches a corresponding one of predetermined residual capacities earlier, if it is estimated that the power capacity of said fuel cell reaches its predetermined residual capacity earlier, said battery run time computing unit determines a run time of said separable battery device, in accordance with said data representative of the rechargeable secondary battery residual capacity, said data representative of the fuel cell residual capacity, and said respective supply currents of said rechargeable secondary battery and of said fuel cell, if it is estimated that the power capacity of said rechargeable secondary battery reaches its predetermined residual capacity earlier, said battery run time computing unit determines the run time of said separable battery device in accordance with the run time of said rechargeable secondary battery, and said battery run time computing unit supplies data representative of the thus determined run time of said battery device to the electronic apparatus through said interface.

* * * * *